(12) United States Patent
Marenski

(10) Patent No.: US 10,379,144 B2
(45) Date of Patent: Aug. 13, 2019

(54) ARRANGEMENT HAVING TWO REDUNDANT MODULES

(71) Applicant: Siemens Aktiengesellschaft, Munich (DE)

(72) Inventor: Dirk Marenski, Karlsruhe (DE)

(73) Assignee: Siemens Aktiengesellschaft, Munich (DE)

( * ) Notice: Subject to any disclaimer, the term of this patent is extended or adjusted under 35 U.S.C. 154(b) by 45 days.

(21) Appl. No.: 15/845,921

(22) Filed: Dec. 18, 2017

(65) Prior Publication Data

US 2018/0172740 A1    Jun. 21, 2018

(30) Foreign Application Priority Data

Dec. 19, 2016  (EP) ..................................... 16205179

(51) Int. Cl.
| | | |
|---|---|---|
| *G05B 9/03* | (2006.01) | |
| *G01R 19/00* | (2006.01) | |
| *G01R 15/14* | (2006.01) | |
| *G01R 15/22* | (2006.01) | |
| *G05B 19/042* | (2006.01) | |

(52) U.S. Cl.
CPC ......... *G01R 19/0092* (2013.01); *G01R 15/14* (2013.01); *G01R 15/22* (2013.01); *G05B 19/0428* (2013.01); *G05B 9/03* (2013.01); *G05B 2219/24182* (2013.01)

(58) Field of Classification Search
CPC ........................ G05B 9/03; G05B 2219/24182
See application file for complete search history.

(56) References Cited

U.S. PATENT DOCUMENTS

| | | | | | |
|---|---|---|---|---|---|
| 5,233,543 | A | * | 8/1993 | Hoglund | .................. G05B 9/03 700/79 |
| 6,161,202 | A | * | 12/2000 | Kuntzsch | ............ G06F 11/1608 714/25 |
| 10,122,291 | B2 | * | 11/2018 | Lee | .......................... G05B 9/03 |

FOREIGN PATENT DOCUMENTS

| | | |
|---|---|---|
| DE | 102004034451 | 2/2006 |
| DE | 112013000204 | 6/2015 |

* cited by examiner

*Primary Examiner* — Noam Reisner
(74) *Attorney, Agent, or Firm* — Cozen O'Connor

(57) ABSTRACT

An arrangement having two redundant modules that monitor one another and that each contain a current or voltage source, which is connected to a first line terminal via a first controllable switch and a first current sensor, wherein each module also has a second line terminal and a ground terminal, between which lies a second current sensor in series with a second controllable switch, where each module, when in the functioning state, closes the controllable switches contained therein, and contains a monitoring device connected to the two current sensors of the modules, the monitoring device generating a monitoring signal identifying the corresponding other module as functioning if at least one of the two current sensors detects a current flow.

8 Claims, 3 Drawing Sheets

ARRANGEMENT HAVING TWO REDUNDANT MODULES

BACKGROUND OF THE INVENTION

1. Field of the Invention

The invention relates to process control systems and, more particularly to, an arrangement having two redundant modules.

2. Description of the Related Art

Process control systems, such SIMATIC PCS 7 manufactured by Siemens, are used for automating processes in technical plants, and usually have a hierarchical structure formed by a plurality of levels. At the field level, field devices are used to detect the states of the technical process (sensors) and/or to influence the process systematically (actuators). At the control level, control processors (programmable logic controllers having CPU units) perform open-loop and closed-loop control functions in the field environment, which involves their receiving input values from the sensors, e.g., from a pressure transducer, and issuing output values to the actuators, e.g., to a positioner for a control valve. At the process management level, the higher-level open-loop and closed-loop control of the process is performed in process control computers.

Data is transferred between the field devices and the control processors typically via a digital field bus, such as PROFIBUS DP or PROFINET. Normally, the field devices themselves do not have a corresponding field bus connection. As a result, they are interfaced to the field bus via distributed peripheral stations. A peripheral station consists of an interface module (header module) for connecting to the field bus, and also consist of a number of input/output modules (digital and analog input and output modules) for connecting the field devices. The input/output modules can comprise one or more channels, to each of which a field device can be connected.

DE 10 2004 034 451 A1, for instance, discloses a control system comprising two redundant control processors, connected to each of which is an input/output module. Either an actuator or a sensor is connected to the two input/output modules. In a fault-free situation, the two control processors simultaneously execute the same control program, although only one of the control processors is active in the sense that it is using its output values to control the actuator or is processing input values received from the sensor to control a process thereby. In the event of a fault, the other, intact, control processor assumes control of the process. The input/output modules can be programmed or parameterized to alternatively operate as input or output modules, working redundantly.

For selective redundant or non-redundant acquisition of measured values from a two-wire measuring transducer, each of the two modules contains a current source or voltage source, which is connected to a first line terminal of the relevant module via a series circuit composed of a first controllable switch and a first current sensor. Each of the two modules also comprises a second line terminal and a ground terminal, between which lies a second current sensor in series with a second controllable switch. The two modules are connected together at their first line terminals via a first line, and at their second line terminals via a second line, where a two-wire measuring transducer is connected between both lines. Depending on the switch setting of the controllable switches, two redundant and two non-redundant operating modes are possible. In the redundant operating modes, the first switch in one of the two modules, and the second switch in the corresponding other module, are closed, where the measurement current from the measuring transducer is detected redundantly by the first current sensor in the one module and by the second current sensor in the other module. In the non-redundant operating modes, the first and second switches in only one of the two modules are closed, where the measurement current is detected either by the first or second current sensor in the relevant module.

DE 10 2004 034 451 A1 fails to disclose mutual monitoring of both input/output modules.

For correct and reliable redundant operation of two modules, such as two input/output modules, each of the modules needs to be informed about the functionality of the other module to prevent, for example, switching over from an active module to a non-existent or non-functioning module.

SUMMARY OF THE INVENTION

In view of the foregoing, it is therefore an object of the invention to provide mutual monitoring of two redundant modules using circuitry of low complexity while also providing redundancy for the monitoring itself.

This and other objects and advantages are achieved in accordance with the invention by an arrangement having a first module and a redundant second module which monitor one another mutually, for which purpose:

each of the two modules contains a current source or voltage source, which either is configured to be switchable on and off and is connected via a first current sensor to a first line terminal of the relevant module, or is connected to the first line terminal via a series circuit composed of a first controllable switch and the first current sensor;

each of the two modules also has a second line terminal and a ground terminal, between which a second current sensor in series with a second controllable switch is arranged;

the first line terminal of the first module is connected via a first line to the second line terminal of the second module, and the first line terminal of the second module is connected via a second line to the second line terminal of the first module;

each of the two modules is configured, when in the functioning state, to switch on its current source or voltage source and to close the second controllable switch contained in said module or to close both of the controllable switches contained in the module; and each of the two modules contains a monitoring device connected to the two current sensors contained in the module, where the monitoring device generates a monitoring signal identifying the corresponding other module as functioning if at least one of the two current sensors detects a current flow.

The line terminals and lines of the above defined arrangement are used solely for the purpose of mutual monitoring of the two modules and not for connecting an actuator or a measuring transducer. Thus, if an actuator or measuring transducer is meant to be connected to the two modules of the arrangement in accordance with the invention, such as in the interconnection disclosed by DE 10 2004 034 451 A1, then this is achieved via separate line terminals and lines that do not form the subject matter of the present invention.

A module is in a functioning state when it is plugged in, supplied with power and has not switched itself off because of a fault. The functioning module can be active but also passive in the sense that although it is not currently performing any module-specific functions it can be activated to do so. In the arrangement according to the invention, when a module is functioning, the controllable switches are closed and both current sensors are active in order to be able to detect a current flow on each of the two lines. If the other module is likewise in a functioning state, then the controllable switches of this module are also closed, with the result that a current flows in both lines. Each of the two modules then detects a current flow in both lines and hence the functionality of the other module in each case. If one of the two lines is discontinuous, both modules still detect a current flow in the other line and hence the functionality of the other module in each case. If, on the other hand, one of the two modules is non-functioning, then its controllable switches are open, with the result that no current flows in either of the two lines and hence the other module detects the non-functionality of the one module.

For the mutual monitoring of both modules, it is merely necessary to detect whether or not a current is flowing. As a result, the current sensors can each be formed as optocouplers having a light emitter (e.g., a light emitting diode) and light receiver (e.g., a photodiode or a phototransistor). Apart from particularly low circuit complexity, this has the additional advantage that by virtue of the galvanic isolation, the output signals from the current sensors are transferred directly at a floating potential to the monitoring device.

Alternatively, the current flow can be detected from a voltage drop across a current sensing resistor. If in each of the two modules such a current sensing resistor is directly connected by one of its terminals to the second line terminal of the relevant module, and the line leading from there to the other module is intact, then a voltage drop across this current sensing resistor can be simultaneously detected in both modules. Here, the first current sensor in the one module and the second current sensor in the other module share a common current sensing resistor in the other module, which reduces the circuit complexity for detecting the current flow.

The controllable switches can be semiconductor switches such as transistor switches, or optocouplers, where again in this case the optocouplers have the advantage of floating-potential control. That is, although the first and second controllable switches of a module lie in different circuits, they can be controlled by one and the same control signal. If the current source or voltage source in the relevant module can be switched on and off, such as in the case of a switchable constant current source, then it is possible to dispense with the first switch in the relevant module.

In an embodiment of the invention, one line or both lines can be used to transfer information useful for the redundant operation, for which purpose at least one of the two modules contains a transmitter for applying an, e.g., zero-mean information signal to at least one of the two lines, and the other module contains a receiver for receiving the information signal. The information may be, for example, a control command applicable to both modules, where the active module receives from the active control processor and transfers to the inactive module. Substitute values are used instead of input or output values if these are not available, are invalid or unreliable. For example, the substitute value may be the output value last received from the module or otherwise another, configurable value that is distinguishable from the operational output values, such as in order to signal a fault or to drive the actuator (e.g, a valve) into a safe position.

With the applied information signal, the transfer of information from the one module to the other can be performed by pulse modulation of the current on one of the lines, for which purpose it is advantageously possible to use the controllable switch lying in the current path of the relevant line and located in the one module, and for the transmitter to switch said controllable switch on and off at a specific pulse/pause ratio or pulse width ratio. The current sensor located in the other module and lying in the current path of the relevant line can be used as a functional component of the receiver to detect the pulse-modulated current. Again, in this case, it proves particularly advantageous to use optocouplers, because this allows floating-potential control of the controllable switch and floating-potential detection of the pulse-modulated current.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In order to explain the invention further, reference is made below to the figures of the drawing, in which.

DETAILED DESCRIPTION OF THE EXEMPLARY EMBODIMENTS

The same reference numbers are used to denote identical and equivalent elements.

Figure 1:
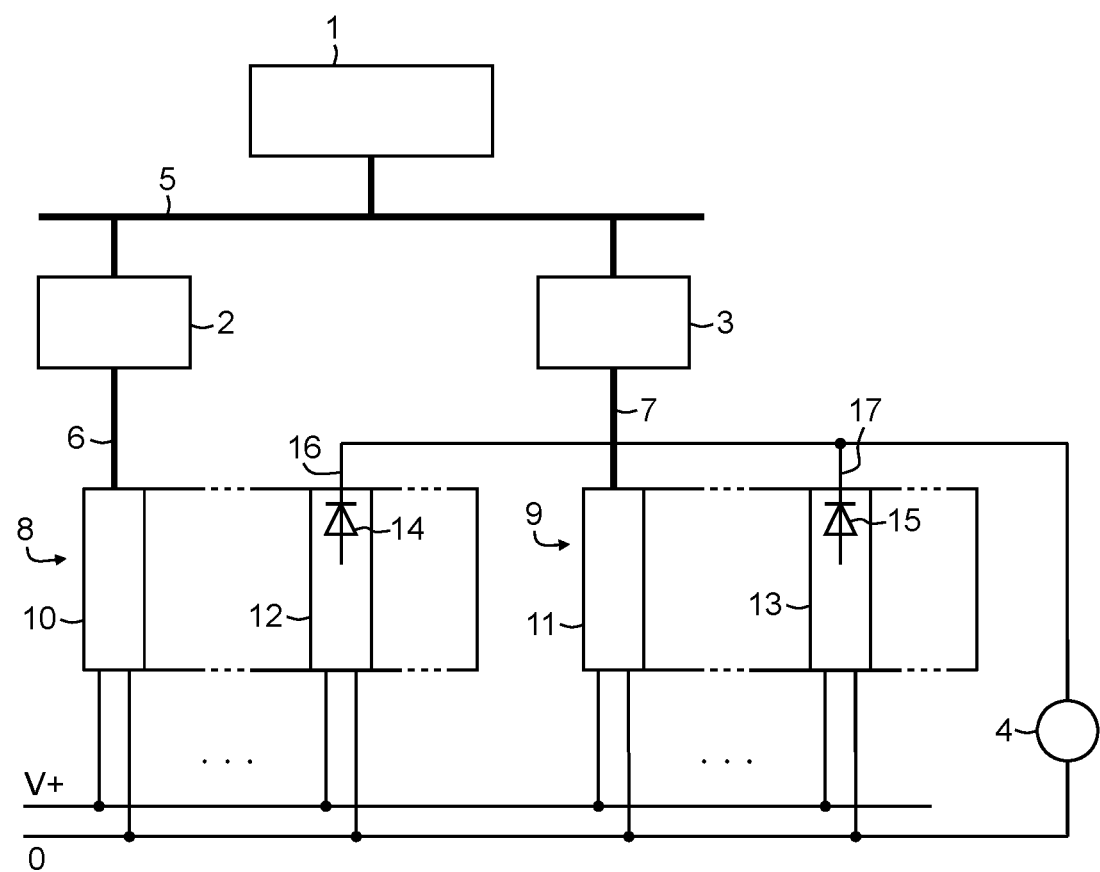
FIG. 1 is a schematic block diagram illustrating a redundant control system having two redundant modules.

FIG. 1 shows a segment of a process control system having a control facility 1 at a process management level, a first and second control processor 2, 3 in the form of programmable logic controllers at a control level, and an actuator 4 at field level. The field level contains other field devices (not shown here) which, formed as sensors, detect the states of a technical process, and formed as actuators, systematically influence the process. The control facility 1 and the control processors 2, 3 are connected to one another via a plant bus 5 (e.g., Ethernet). In order to generate output values for the actuator 4, the two control processors 2, 3 each execute in redundant operation one and the same control program or user program, where they process, inter alia, input values received from sensors via separate digital field buses 6, 7 (e.g., PROFIBUS DP). The field devices are interfaced to the field buses 6, 7 of the two control processors 2, 3 via a first and second distributed peripheral station 8, 9. Each of the two peripheral stations 8, 9 consists of an interface module (header module) 10, 11 for connecting to the relevant field bus 6, 7 and consist of a number of single-channel or multichannel input/output modules, of which just one output module 12, 13 is shown here for each station. The actuator 4 is connected via decoupling diodes 14, 15 to the signal outputs 16, 17 of the two output modules 12, 13. The interface modules 10, 11 transfer output values, which are received from the corresponding control processor 2, 3 for the actuator 4, to the output modules 12, 13, where the diodes 14, 15 combine digital values by a disjunctive (OR) operation and add analog values (currents) for the actuator 4. Both output modules 12, 13 are active. In fault-free redundant operation, the output modules 12, 13 both receive the same output values. The two control processors 2, 3 synchronize themselves accordingly. Alternatively, only one of the two modules, such as module 12, is active and transfers the output values received from the control processor 2 to the actuator 4.

The interface modules 10, 11 each monitor the field bus 6, 7 to which they are connected, and in the event of a fault, such as if the control processor fails (e.g., operating state STOP or cable pulled out) issue a command to all the output modules of the relevant peripheral station 8, 9 to output substitute values, such as in the form of the last received output values.

Figure 2:
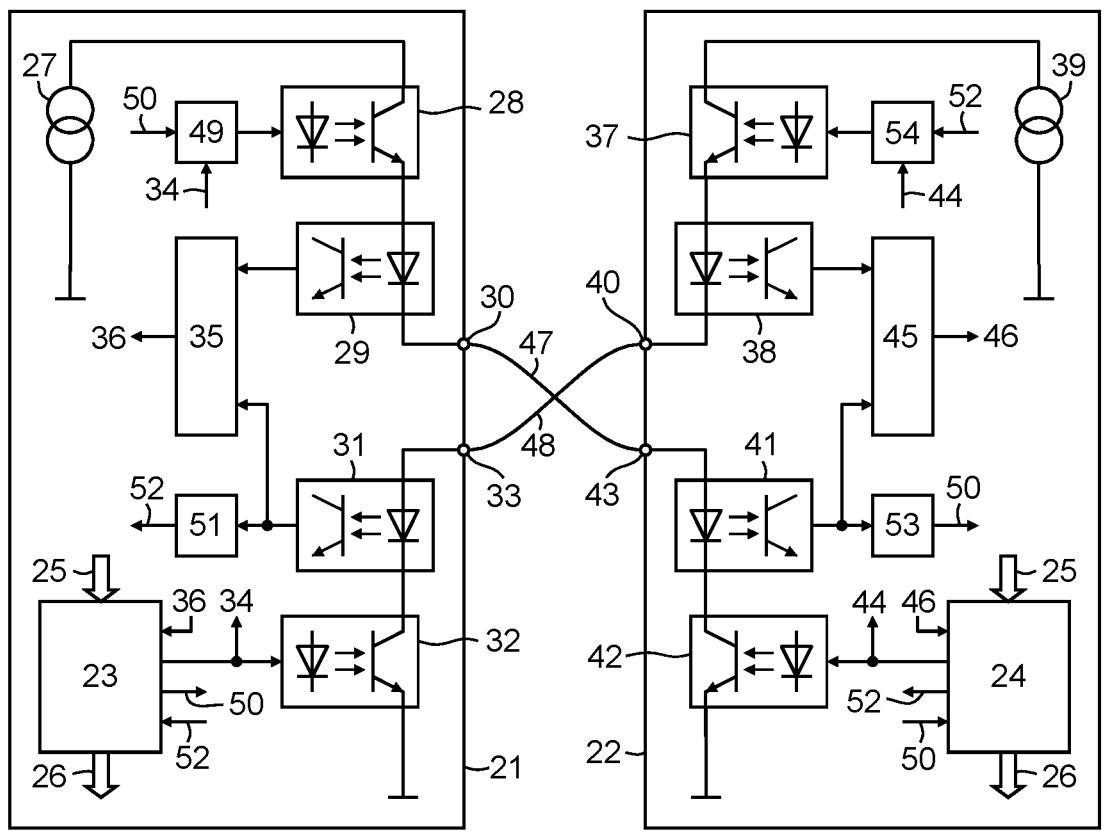
FIG. 2 is a schematic block diagram of a first exemplary embodiment illustrating the arrangement in accordance with the invention having two modules in which optocouplers are used as the switches and current sensors.

FIG. 2 shows an example of the arrangement in accordance with the invention having two redundant modules 21, 22, where the modules may be the two output modules 12, 13 of FIG. 1 or any other module type. Both modules, i.e., the first module 21 and the second module 22, have the same configuration and both contain a function unit 23, 24 for performing module-specific functions which involve receiving input data 25 and generating output data 26.

The first module 21 contains a current source 27 (or alternatively a voltage source), which is connected to a first line terminal 30 via a series circuit composed of a first controllable switch 28 and a first current sensor 29. The module 21 also contains a second current sensor 31, which lies in series with a second controllable switch 32 between a second line terminal 33 and ground. In the exemplary illustrated embodiment, the controllable switches 28, 32 and the current sensors 29, 31 each consist of an optocoupler comprising light emitting diode and phototransistor.

In the functioning state, i.e., if the module 21 is plugged in, supplied with power and has not switched itself off because of a fault, the function unit 23 generates a control signal 34, which is used to close the controllable switches 28, 32. In the functioning state, the module 21 can be active but also passive in the sense that although it is not currently performing any module-specific functions it can be activated to do so.

The two current sensors 29, 31 are intended to detect a current flowing via the first and second line terminals 30, 33 respectively, and to signal this current flow to a monitoring device 35, which then generates a monitoring signal 36 for the function unit 23 if at least one of the two current sensors 29, 31 detects a current flow.

The redundant second module 22 likewise contains a first controllable switch 37 and a first current sensor 38 between a current source 39 (or voltage source) and a first line terminal 40, and contains a second current sensor 41 in series with a second controllable switch 42 between a second line terminal 43 and ground. Again, in this case, the controllable switches 37, 42 and the current sensors 38, 41 consist of optocouplers.

In the functioning state of the second module 22, the function unit 24 generates a control signal 44, which is used to close the controllable switches 37, 42. The two current sensors 38, 41 signal to a monitoring device 45 a current flow occurring via the first and second line terminals 40, 43 respectively, where the monitoring device then generates a monitoring signal 46 for the function unit 24 if at least one of the two current sensors 38, 41 signals such a current flow.

The first line terminal 30 of the first module 21 is connected via a first line 47 to the second line terminal 43 of the second module 22. A second line 48 connects the first line terminal 40 of the second module 22 to the second line terminal 33 of the first module 21. The first current sensor 29 in the first module 21, and the second current sensor 41 in the second module 22 thus detect a possible current flow on the first line 47, while first current sensor 38 in the second module 22 and the second current sensor 31 in the first module 21 detect a current flow on the second line 48.

When the first module 21 is functioning, the controllable switches 28, 32 are closed and both current sensors 29, 31 are active in order to be able to detect a current flow on each of the first and second lines 47, 48. If the other module 22 is likewise in a functioning state, then the controllable switches 37, 42 of this module are also closed. As a result, a current flows in both the first and second lines 47, 48. The current sensors 29, 31 in the first module 21, and the current sensors 38, 41 in the second module 22 then detect a current flow on both the first and second lines 47, 48, with the result that the monitoring devices 35 and 36 respectively arranged thereafter generate respective monitoring signals 36 and 46 that each indicate that the corresponding other module 22 or 21 is functioning. Even if one of the two lines, e.g. first line 47, is discontinuous, both modules 21, 22 still detect a current flow in the second line 48 and hence the functionality of the other module in each case. If, on the other hand, the module 22 is not plugged in or is unable to function, for instance, then its controllable switches 37, 42 are open. As a result, current does not flow in either of the first and second lines 47, 48 and the first module 21 identifies the non-functionality of the second module 22 from the fact that neither of the current sensors 29, 31 are detecting a current flow.

In order to transfer information useful for the redundant operation, the first module 21 contains a transmitter 49 for applying an information signal 50 generated by the function unit 23 to the first line 47, and a receiver 51 for receiving an information signal 52 received from the second module 22 via the second line 48. The function unit 23 controls the transmitter 49 and receivers 51. In the identically configured second module 22, a receiver 53 receives the information signal 50 received from the first module 21 via the first line 47, while a transmitter 54 applies the information signal 52 to the second line 48.

In the exemplary illustrated embodiment, the information signals 50, 52 are applied to the first and second lines 47, 48 by pulse modulation of the current supplied by the corresponding current sources 27, 39, with the controllable switches 28, 37 (or alternatively the switches 32, 42) being used for this purpose and hence forming part of the corresponding transmitter. The current sensors 31, 41 detect the pulse modulation of the current and hence receive the information signals, and therefore are part of the corresponding receiver.

As explained below, components such as electromechanical switches or semiconductor switches or current sensing resistors, for instance, can be used for the controllable switches and/or current sensors instead of the optocouplers shown in FIG. 2.

Figure 3:
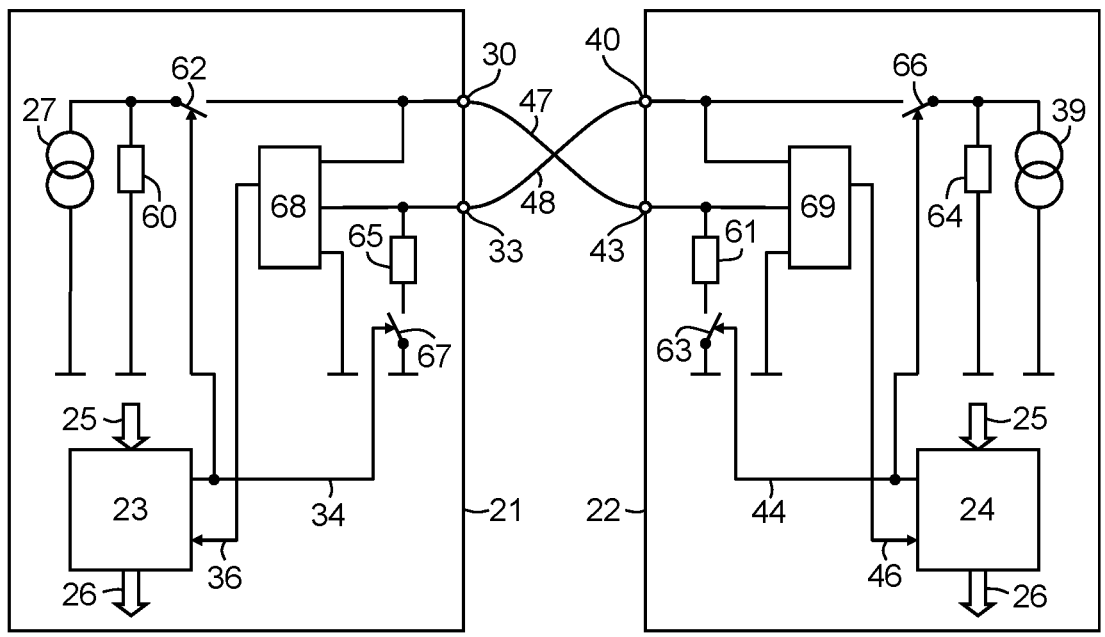
FIG. 3 is a schematic block diagram illustrating a second exemplary embodiment of the arrangement in accordance with the invention having current sources and current sensing resistors in the modules.

FIG. 3 shows an alternative exemplary arrangement in accordance with the invention, in which the first current source 27, in the first module 21, and the second current source 30, in the second module 22, are connected to ground via a first current divider and a second current divider respectively. The first current divider comprises a first resistor 60 and a second resistor 61, where the first resistor 60 is arranged together with a first controllable switch 62 in the first module 21, and the second resistor 31 is arranged in series with a second controllable switch 63 in the second module 22. The resistors 60, 61 of the first current divider, which are arranged in the different modules 21, 22, are connected together via the first line 47. The first controllable switch 62 is arranged between the first line 47 and the first current source 27 and respectively the first resistor 60 connected in parallel therewith.

The second current divider, which is connected to the second current source 39, likewise comprises a first resistor 64 and a second resistor 65, where the first resistor 64 is arranged together with a first controllable switch 66 in the second module 22, and the second resistor 65 is arranged in series with a second controllable switch 67 in the first module 21. The resistors 64, 65 of the second current divider, which are arranged in the different modules 21, 22, are connected together via the second line 48. The first controllable switch 66 is arranged between the second line 48 and the second current source 39 and respectively the first resistor 64 connected in parallel therewith.

The first resistor 60, 64 of each of the two current dividers conducts the current from the respective current sources 27 and 39 when the first switch 62 and 66 respectively is open. The first resistor 60, 64 is set to a value such that the voltage drop across this resistor does not exceed a maximum value. For real current sources 27, 39 having current limiting, the first resistor 60, 64 can be formed by the internal resistance of the relevant current source.

The controllable switches 62, 63, 66, 67 are controlled by control signals 34, 44 generated by the function units 23, 24 such that the switches 62 and 67 in the first module 21 are closed when the module 21 is functioning, and the switches 66 and 63 in the second module 22 are closed when the module 22 is functioning. For example, the controllable switches 62, 63, 66, 67 may be semiconductor switches, such as transistors or MOSFETs, optocouplers or electro-mechanical switches (relay switches).

In each of the two modules 21, 22, a monitoring device 68 and 69 respectively is connected to the first and second lines 47, 48, where the monitoring device detects the voltages between each of the first and second lines 47, 48 and ground and generates a monitoring signal 36, 46 identifying the corresponding other module as functioning if at least one of the two detected voltages has a value equal to the voltage drop expected across the second resistors 61, 65 when switches 62, 63, 66, 67 are in the closed position.

It should be understood all the resistors 60, 61, 64, 65 are of equal value R. The current sources 27, 39 each supply a current I. When both modules 21, 22 are functioning, all the switches 62, 63, 66, 67 are closed and both monitoring devices 68, 69 detect a voltage $U=I/2 \cdot R$ at each of the first and second lines 47, 48. This indicates for each of the two monitoring devices 68, 69 that the other module is functioning.

If, for instance, the second line 48 now breaks, then there no current flows through the resistor 65. As a result, the current I from the current source 39 flows solely through the resistor 64 and produces a voltage drop $U=I \cdot R$. The monitoring device 68 in the first module 21 measures the voltage $U=I/2 \cdot R$ at the line 47 and the value zero at the line 48. The monitoring device 69 in the second module 22 measures the voltage $U=I \cdot R$ at the line 48 and the voltage $U=I/2 \cdot R$ at the line 47. At least one of the voltages detected by the monitoring device 68 and at least one of the voltages detected by the monitoring device 69 equals $U=I/2 \cdot R$. As a result, both monitoring devices 68, 69 establish, despite the break in the line 48, that the other, opposite module is functioning.

If when the first and second lines 47, 48 are intact the second module 22 is not functioning, then its switches 63, 66 are open. The switches 62, 67 of the functioning first module 21 are closed. The first monitoring device 68 measures the voltage $U=I \cdot R$ at the line 47 and the value zero at the line 48. Since both detected voltages differ from $U=I/2 \cdot R$, the monitoring device 68 hence identifies the failure or non-existence of the other, opposite module 22.

As in the example shown in FIG. 2, information 50, 52 to be exchanged between the modules 21, 22 can be transmitted and received by pulse modulation of the currents flowing in the first and second lines 47, 48. For zero-mean modulation, the mean value of the current on the lines 47, 48 can be used for the mutual monitoring of the modules 21, 22 and is not affected by the modulation component used for the information transfer. The information can be modulated onto the currents in the lines 47, 48 by various means, e.g., inductively, and received in the same manner.

Figure 4:
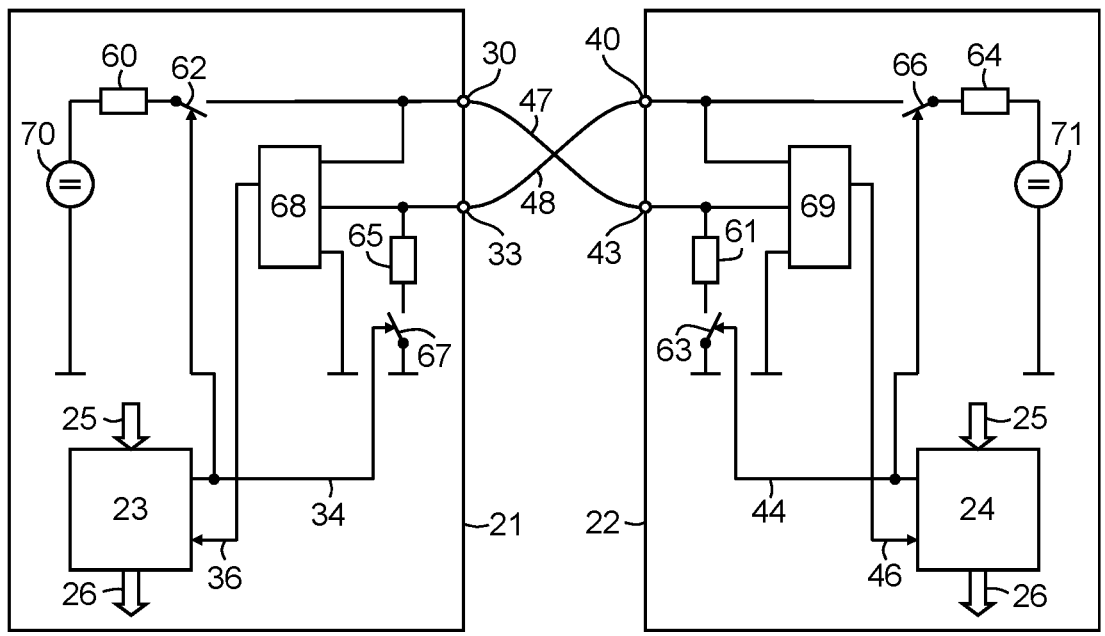
FIG. 4 is a schematic block diagram of another exemplary embodiment of the arrangement in accordance with the invention having voltage sources and current sensing resistors in the modules.

FIG. 4 shows another example of the two redundant modules 21, 22, which differs from the example shown in FIG. 3 in that instead of current sources a first and second voltage source 70, 71 is present in the different modules 21, 22. The resistors 60, 61 form a first potential divider, across which the first voltage source 70 is connected to ground. The resistors 64, 65 form a second potential divider, across which the second voltage source 71 is connected to ground.

Here, it should be understood all the resistors 60, 61, 64, 65 are of equal value R. The voltage sources 70, 71 each supply a voltage U. When both modules 21, 22 are functioning, all the switches 62, 63, 66, 67 are closed and both monitoring devices 68, 69 detect at each of the first and second lines 47, 48 a voltage U/2. This indicates that for each of the two monitoring devices 68, 69 the corresponding other module is functioning. In the event of a discontinuity in the second line 48, the monitoring device 68 in the first module 21 measures the voltage U/2 at the first line 47 and the value zero at the second line 48. The monitoring device 69 in the second module 21 measures the voltage U at the second line 48 and the value U/2 at the line 47. At least one of the voltages detected by the monitoring device 41 and at least one of the voltages detected by the monitoring device 42 equals U/2. Consequently, both monitoring devices 68, 69 establish, despite the break in the second line 48, that the other, opposite module in each case is functioning.

Figure 5:
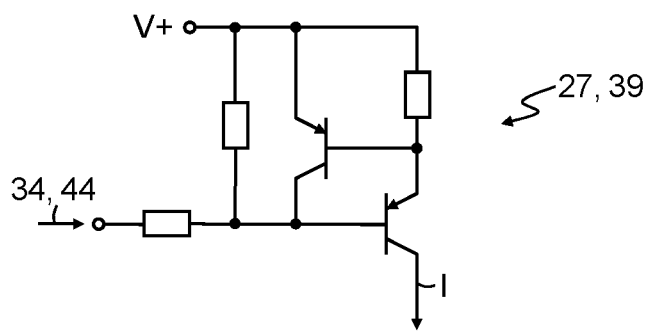
FIG. 5 is a schematic black diagram of an exemplary switchable current source.

FIG. 5 shows an exemplary embodiment of the current source 27 or 39 as a switchable constant current source, so that it is possible to dispense with the first switch 28, 37 (FIG. 2) or 62, 66 (FIG. 3) in the relevant module 21, 22.

Thus. while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An arrangement comprising:
a first module;
and a redundant, second module, the first module and the redundant, second module operatively monitoring one another mutually;
wherein the first module and redundant, second module each includes: a current source or voltage source, which is one of (i) switchable on and off and is connected via a first current sensor to a first line terminal of a respective module of the first module and redundant, second module and (ii) connected to a first line terminal via a series circuit formed by a first controllable switch and a first current sensor; and
a second line terminal and aground terminal, between which is operatively connected a second current sensor in series with a second controllable switch;
wherein the first line terminal of the first module is connected via a first line to the second line terminal of the second module, and the first line terminal of the second module is connected via a second line to the second line terminal of the first module; and
wherein the first module and redundant, second module are, when in a functioning state, configured to switch on its current source or voltage source and further configured to one of (i) close the second controllable switch contained in said respective module of the first module and redundant, second module and (ii) close the first and second controllable switches contained in said respective module of the first module and redundant, second module;
wherein the first module and redundant, second module each additionally include:

a monitoring device connected to the first and second current sensors contained in said respective module of the first module and redundant, second module, said monitoring device generating a monitoring signal which identifies a corresponding other module of the first module and redundant, second module as functioning if at least one of the first and second current sensors detects a current flow.

2. The arrangement as claimed in claim 1, wherein the first and second current sensors are formed as optocouplers.

3. The arrangement as claimed in claim 1, wherein the first and second current sensors each comprise a current sensing resistor; and wherein the monitoring device is configured to detect a voltage drop across the current sensing resistor.

4. The arrangement as claimed in claim 3, wherein the first current sensor in the first module and the second current sensor in the redundant, second module have a common current sensing resistor in a corresponding other module, said resistor being connected at one end to the second line terminal of the corresponding other module.

5. The arrangement as claimed in claim 1, wherein the first and second controllable switches are formed as optocouplers.

6. The arrangement as claimed in one claim 1, wherein at least one of the first module and the redundant, second module comprises a transmitter for applying an information signal to at least one of the first and second lines, and wherein a corresponding other module includes a receiver for receiving the applied information signal.

7. The arrangement as claimed in claim 6, wherein one controllable switch of the first and second controllable switches, located within the at least one of the first module and the redundant, second module, forms part of the transmitter; and wherein the transmitter is configured for pulse modulation by the controllable switch of a current supplied by the current source or voltage source.

8. The arrangement as claimed in claim 7, wherein one current sensor of the first and second current sensors, located within the corresponding other module, forms part of the receiver to receive the pulse-modulated current.

\* \* \* \* \*